US008384444B1

(12) United States Patent
Lucero et al.

(10) Patent No.: US 8,384,444 B1
(45) Date of Patent: Feb. 26, 2013

(54) I/O DRIVER WITH PASS GATE FEEDBACK CONTROLLED OUTPUT DRIVER

(75) Inventors: Elroy Lucero, San Jose, CA (US); Khusrow Kiani, Oakland, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/218,937

(22) Filed: Sep. 3, 2005

(51) Int. Cl.
*H03K 3/00* (2006.01)
(52) U.S. Cl. ...................................................... 327/108
(58) Field of Classification Search .................. 327/108, 327/112; 326/82, 83
See application file for complete search history.

(56) References Cited

U.S. PATENT DOCUMENTS

| | | | | |
|---|---|---|---|---|
| 5,748,019 A * | 5/1998 | Wong et al. | ................... | 327/170 |
| 6,018,256 A * | 1/2000 | Kumagai et al. | .............. | 327/112 |
| 6,137,322 A * | 10/2000 | Ten Eyck | ...................... | 327/112 |
| 6,351,172 B1 * | 2/2002 | Ouyang et al. | ................ | 327/333 |
| 6,380,772 B1 * | 4/2002 | Sutardja | ......................... | 327/112 |
| 7,126,389 B1 * | 10/2006 | McRae et al. | ................. | 327/112 |
| 7,215,152 B2 * | 5/2007 | Dubey | ............................ | 326/83 |

* cited by examiner

*Primary Examiner* — Lincoln Donovan
*Assistant Examiner* — Khareem E Almo
(74) *Attorney, Agent, or Firm* — Wade J. Brady, III; Frederick J. Telecky, Jr.

(57) ABSTRACT

In an I/O driver, noise reduction is achieved while maintaining good performance, by providing a conventional output driver leg and a secondary output driver leg, the primary output driver leg comprising a primary predriver and a primary output driver, and the secondary output driver leg comprising a secondary output driver having a common output with the primary output driver, wherein feedback from the common output is fed through a pair of pass gates that control the secondary output driver.

7 Claims, 2 Drawing Sheets

I/O DRIVER WITH PASS GATE FEEDBACK CONTROLLED OUTPUT DRIVER

FIELD OF THE INVENTION

The invention relates to an I/O driver. In particular it relates to an output driver in which the I/O noise is reduced by controlling the slew rate di/dt of the output driver.

BACKGROUND OF THE INVENTION

An essential part of I/O design is to limit the interface noise, ground bounce and cross-talk. This has become increasingly important as the pin count for complex ICs has increased.

One approach to reducing power/ground noise has been to add more power and ground pins. Another solution has been to include a decoupling capacitor between power and ground and yet another has been to control the slew rate of the driver output, to make the turn-on more gradual by providing several driver legs, each designed with a different turn-on time and turn-on rate.

Yet another approach to reducing I/O noise is described in commonly owned application, previously filed, entitled "HIGH SPEED LOW NOISE I/O DRIVER WITH FEEDBACK CONTROL". In this I/O driver the slew rate is controlled by providing at least one conventional I/O leg comprising a predriver and an output driver, and providing at least one secondary leg comprising a predriver and an output driver, wherein the secondary leg is controlled by feedback from the output of the I/O driver.

The present invention provides another approach to reducing the slew rate of the I/O driver by also making use of feedback from the I/O driver output.

SUMMARY OF THE INVENTION

According to the invention, there is provided an I/O driver that includes a primary pre-driver and primary output driver, and further includes a secondary output driver connected to a common output with the primary output driver, the secondary output driver being controlled by feedback from the common output that is passed through a pair of pass gates, wherein the pass gates are controlled by Data and Enable signals similar to those controlling the primary pre-driver. The pass gates may each be a full pass gate or a half pass gate comprising an NMOS transistor. In the case of a pair of full pass gates each comprising a PMOS transistor and an NMOS transistor, the first pass gates may control the PMOS pull-up transistor of the secondary output driver, and the second pass gates may control the NMOS pull-down transistor of the secondary output driver. The gate of the NMOS transistor of the first pass gate may receive a control signal from the primary pre-driver via a first inverter. The gate of the PMOS transistor of the second pass gate may also receive a control signal from the primary pre-driver via a second inverter. The primary pre-driver typically includes a primary NAND gate controlling a PMOS pull-up transistor of the primary output driver, and further includes a primary NOR gate controlling an NMOS pull-down transistor of the primary output driver. Typically the output from the primary NAND gate and its inversion by means of the first inverter is used to control the first pass gate, and the output from the NOR gate and its inversion by means of the second inverter is used to control the second pass gate. Each pass gate is preferably connected to the feedback from the common output via a resistor. The output from the first pass gate is preferably connected to a PMOS pull-up transistor that is controlled by an output from the first inverter. The output from the second pass gate is preferably connected to an NMOS pull-down transistor that is controlled by an output from the second inverter.

The ratio of the sizes of the primary output driver transistors and secondary output driver transistors may vary. Typically, as the size requirements of a transistor increase, it is implemented by providing a plurality of legs. Thus each primary output driver may comprise several output driver legs. Similarly, each secondary output driver may comprise several output driver legs. For ease of discussion, however, the primary and secondary output drivers will be referred to in the singular, it being understood that size differences between the transistors may be implemented by providing several legs of output drivers.

DETAILED DESCRIPTION OF THE INVENTION

Figure 1:
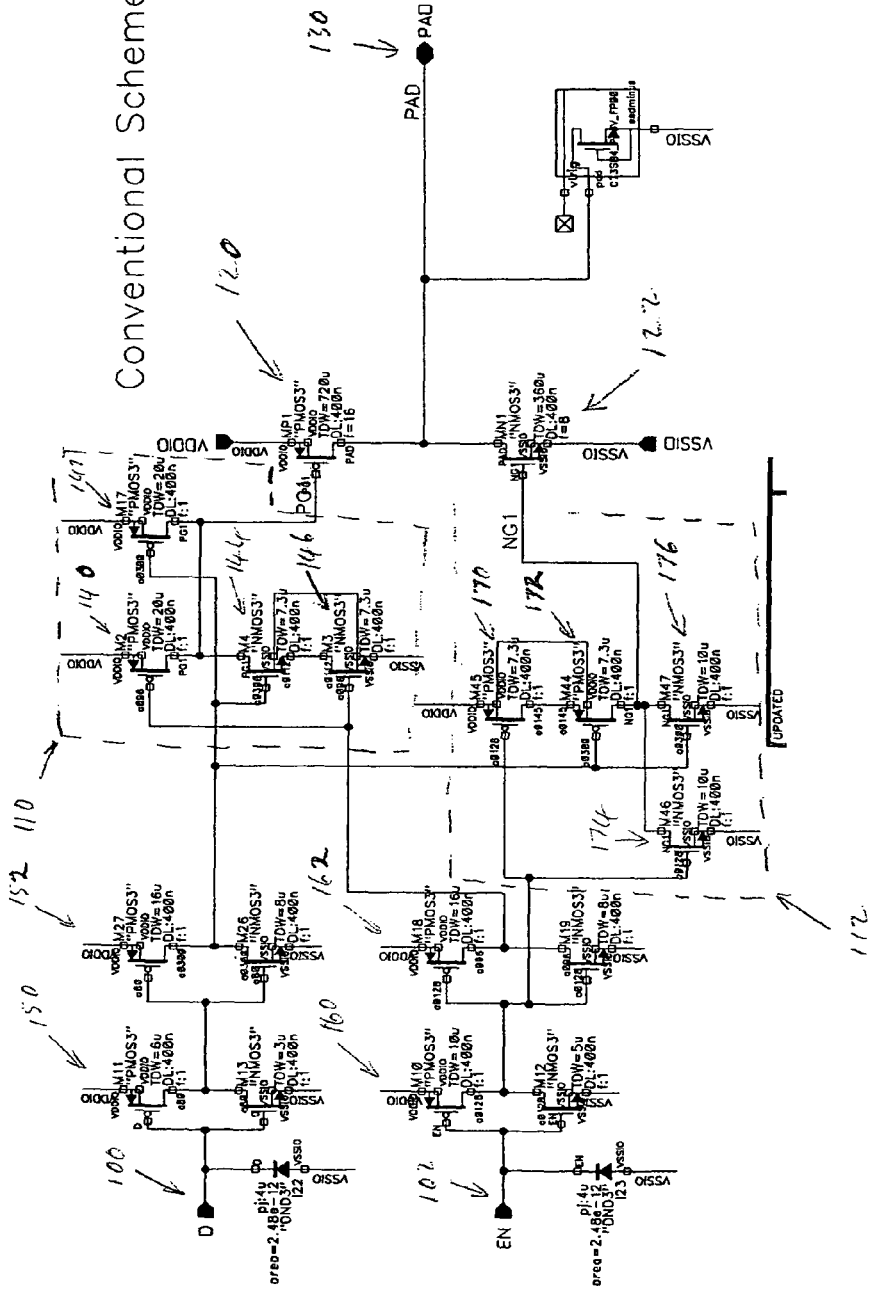
FIG. 1 shows a circuit diagram of a typical I/O driver with predriver and output driver.
Figure 2:
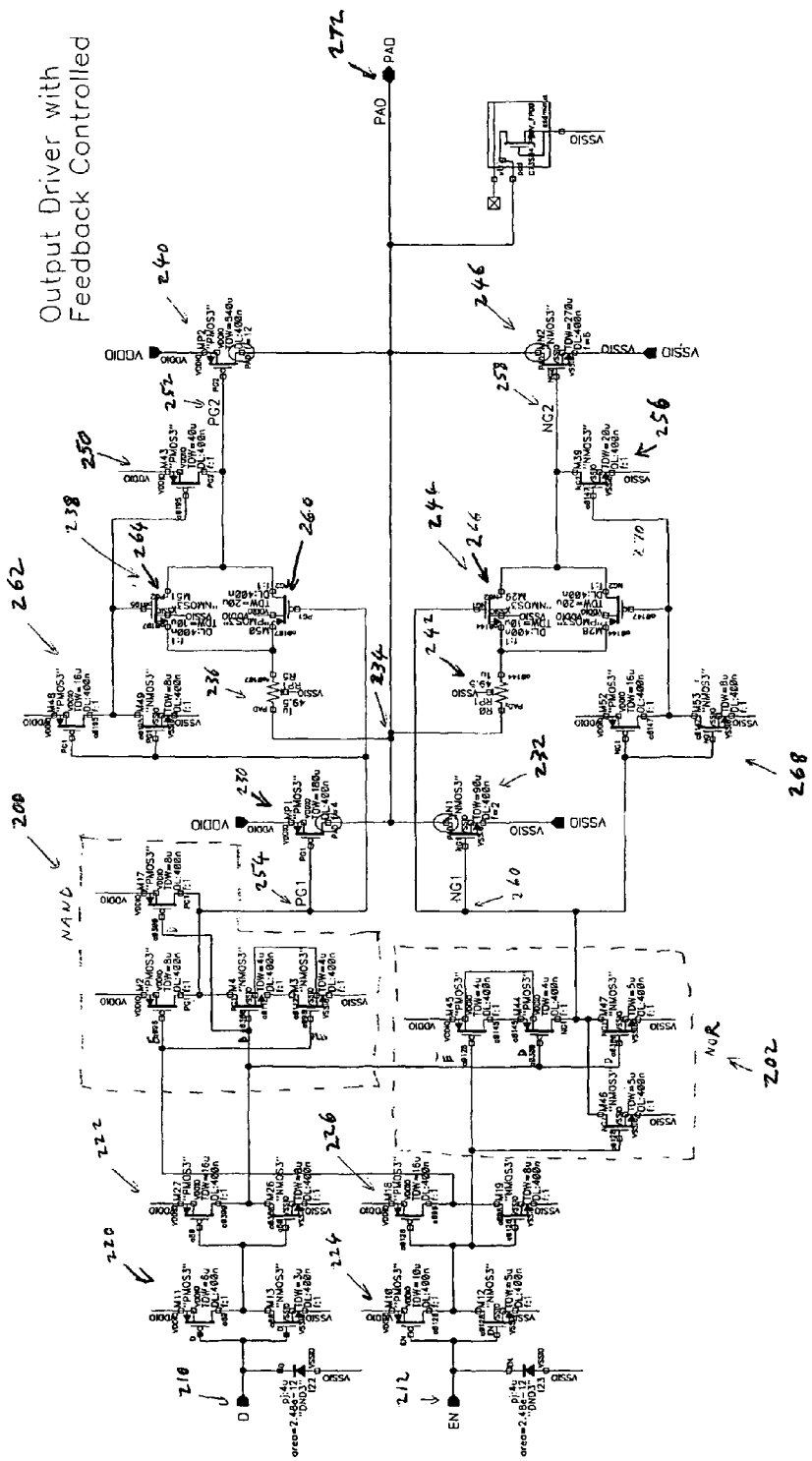
FIG. 2 shows a circuit diagram of one embodiment of the invention.

FIG. 2 shows one embodiment of an I/O driver of the invention. As in the prior art circuit of FIG. 1 the present circuit includes a predriver in the form of a NAND gate 200 and a NOR gate 202, which both receiver data and enable inputs. In the case of the NAND gate, the data and enable inputs 210, 212, respectively, both pass through two inverters. The data input 210 passes through inverters 220 and 222, while the enable input passes through inverters 224, 226. In the case of the NOR gate 202 the data input again passes through the two inverters 220, 222, but the enable input passes only through the inverter 224. Thus the inputs to the NOR gate are, in fact the data input and the inverted enable input.

The NAND gate output feeds into the PMOS pull-up transistor 230 of the output driver, while the NOR gate feeds into the NMOS pull-down transistor 232 of the output driver.

In order to reduce the slew rate of the I/O driver, the present invention provides for a secondary output driver as will be discussed in greater detail below. By providing a conventional predriver and output driver to carry only part of the current, the size of the conventional predriver and output driver, which will be referred to herein as the primary pre-driver and primary output driver, can be reduced in size. This allows the slew rate, di/dt, of the I/O driver to be reduced. To avoid degrading the performance, drive capability and speed of the I/O driver, the present invention provides the secondary output driver, which make use of feedback from the output of the I/O driver.

In the embodiment shown in FIG. 2, the secondary output driver is depicted as comprising one pull-up and one pull-down transistor, however, it will be appreciated that depending on the size requirements of the transistors, the secondary output driver may be implemented as several output driver legs. Similarly, the size of the primary output driver may be varied thereby achieving different size rations between the primary and secondary output drivers. Again, larger size transistors used in the primary output driver are typically implemented as several legs of transistors. For convenience, however, the singular term primary or secondary output driver leg, will be used even if the transistors may be implemented as multiple transistor legs.

The Feedback from node 234 is fed through resistor 236 into a full pass gate 238, the output of which controls the gate of secondary PMOS driver transistor 240. Feedback from node 234 is also fed through a resistor 242 into a second full pass gate 244, the output of which controls the gate of secondary NMOS driver transistor 246. The feedback also includes a pull-up transistor 250 to pull up the node 252 (PG2) when node 254 (PG1) is high. Similarly the lower portion of the secondary leg includes a pull-down transistor 256 to define the voltage on the node 258 (NG2) when the node 260 (NG1) is low. For convenience, the term secondary leg is used herein to refer to the secondary output driver, pass gates and pull-up and pull-down transistors 250, 256.

Thus, as will become clearer from the discussion below, node 254 (PG1) controls PMOS 230 of the primary pull-up output driver, as well as PMOS 260 of the pass gate 238. Through first inverter 262, node 254 also controls the NMOS 264 of the pass gate 238. Similarly, node 260 (NG1) controls the gate of the NMOS transistor 232 of the primary pull-down output driver, and the gate of the NMOS 266 of the pass gate 244. Through second inverter 268, node 260 also controls the PMOS 270 of the pass gate 244.

When the data input 210 and enable input 212 are both high the output of the primary output driver, which is connected to the pad 272 goes high. Thus node 234 from which the feedback is taken will be high. Node 254 (PG1) and node 260 (NG1) will both be low. The low node 254 causes PMOS 260 of pass gate 238 to be on and NMOS 264 of pass gate 238 to also be on due to first inverter 262 causing the gate of the NMOS 264 to go high. Thus the voltage on node 234 is passed to the node 252 (PG2) which turns on PMOS 240 after a time delay caused by the pass gate 238. It will be appreciated that as the voltage continues to rise, the output from the pass gate 238 will turn off the pull-up transistor 240. The resistor 236 serves as an ESD protection device. A 50Ω resistor for resistor 236 has been found to work well. The low node 260 will at the same time disable the pass gate 244 because the low on the gate of NMOS 266 and the high on the gate of PMOS 270 (due to inverter 268) will turn both transistors of pass gate 244 off. To avoid an indeterminate state on node 258 (NG2), the pull down transistor 256 turns on to pull node 258 to ground, thereby ensuring that secondary NMOS output driver transistor 246 is off and pad 272 is high. Thus, when the pad goes high, after a time delay provided by the pass gate 244, the additional current from the secondary output driver is added to the overall output driver current, and as the voltage continues to rise on node 234, the secondary output driver automatically turns off.

Similarly, when the node 234 goes low (i.e., nodes 254, 260 are high and the primary pull-down output driver pulls the pad 272 low), pass gate 238 is disabled and pull up transistor 250 pulls the node 252 high to turn off secondary PMOS output driver transistor 240. The pass gate 244, in this case, turns on and passes the Pad voltage through a resistor 242 to the node 258. Initially the secondary NMOS pull-down transistor 246 will still be on but as the voltage continues to drop at node 258, transistor 246 will turn off. The resistor 242 of 50Ω serves for ESD protection.

While a specific embodiment was described with respect to FIG. 2, it will be appreciated that other embodiments can be provided without departing from the scope of the invention. For instance, the pass gates to the secondary output driver could simply be half pass gates involving only NMOS transistors instead of the full pass gates 238, 244.

What is claimed is:

1. An I/O driver comprising,
   at least one primary output driver that includes at least one PMOS transistor cascoded with at least one NMOS transistor with an output between the at least one PMOS transistor and the at least one NMOS transistor
   at least one secondary output driver that includes at least one PMOS transistor having a control gate and being cascoded with at least one NMOS transistor that includes a control gate, wherein the secondary output driver provides an output between the at least one PMOS transistor and the at least one NMOS transistor, the outputs of the primary and secondary output drivers being connected directly to each other to define a common output, wherein each primary output driver is controlled by a pre-driver that includes a NAND gate and a NOR gate, and each secondary output driver is controlled by control means for controlling the secondary output driver, which control means includes a feedback signal from the common output passed to a pair of pass gates, the pass gates being controlled by the pre-driver, the control gate of the PMOS transistor of the secondary output driver being provided with a pull-up transistor, and the control gate of the NMOS transistor of the secondary output driver being provided with a pull-down transistor, the pull-up transistor and pull-down transistor being controlled by said pre-driver.

2. An I/O driver of claim 1, wherein the pass gates each comprise a full pass gate, or a half pass gate that includes an NMOS transistor.

3. An I/O driver of claim 2, wherein, the full pass gates, each comprises a PMOS transistor and an NMOS transistor, the first pass gate controls the PMOS transistor of the secondary output driver, and the second pass gate controls the NMOS transistor of the secondary output driver.

4. An I/O driver of claim 1, wherein the first pass gate is controlled by the NAND gate of the pre-driver, and the second pass gate is controlled by the NOR gate of the pre-driver.

5. An I/O driver of claim 4, wherein each pass gate is connected to the feedback from the common output via a resistor.

6. An I/O driver of claim 5, wherein for each secondary output driver the output from the first pass gate is connected to the pull-up transistor that is controlled by an output from the NAND gate.

7. An I/O driver of claim 6, wherein for each secondary output driver, the output from the second pass gate is connected to the pull-down transistor that is controlled by an output from the NOR gate.

* * * * *